US007884551B2

(12) United States Patent
Shun'ko

(10) Patent No.: US 7,884,551 B2
(45) Date of Patent: Feb. 8, 2011

(54) RF PLASMA SOURCE WITH QUASI-CLOSED SOLENOIDAL INDUCTOR

(75) Inventor: Evgeny V. Shun'ko, Superior Township, MI (US)

(73) Assignee: Shunko, Inc., Superior Township, MI (US)

( * ) Notice: Subject to any disclaimer, the term of this patent is extended or adjusted under 35 U.S.C. 154(b) by 226 days.

(21) Appl. No.: 12/378,726

(22) Filed: Feb. 19, 2009

(65) Prior Publication Data
US 2009/0153060 A1   Jun. 18, 2009

Related U.S. Application Data

(63) Continuation-in-part of application No. 11/607,603, filed on Dec. 1, 2006, now Pat. No. 7,514,875.

(51) Int. Cl.
*H01J 7/24* (2006.01)
(52) U.S. Cl. .......................... 315/111.21; 315/111.51; 315/111.71
(58) Field of Classification Search ............ 315/111.21, 315/111.31, 111.41, 111.51, 111.71; 118/723 MP
See application file for complete search history.

(56) References Cited

U.S. PATENT DOCUMENTS 5,464,476 A * 11/1995 Gibb et al. ............. 118/723 MP
5,619,103 A *  4/1997 Tobin et al. ............. 315/111.21

6,815,899 B2 * 11/2004 Choi ...................... 315/111.21
6,825,618 B2 * 11/2004 Pu et al. .................. 315/111.51
6,897,616 B2 *  5/2005 Dandl .................... 315/111.41

* cited by examiner

*Primary Examiner*—David Hung Vu
(74) *Attorney, Agent, or Firm*—Carothers & Carothers

(57) ABSTRACT

The present invention pertains to RF (radio frequency) inductive coupling plasma (ICP) sources exciting and maintaining plasma within a closed and vacuum sealed discharge chamber filled with a gaseous medium at a controllable pressure in the range from 1 mTorr to atmospheric pressure. The inductively couple plasma source of the present invention includes a radio frequency source, a quasi-closed O-type solenoidal inductor comprised of two equal section U-shaped solenoid coil halves separated from one another to form two operating gaps between aligned spaced ends of the solenoid coil halves. Each of the U-shaped halves of the solenoid coil is sectioned to have an electrical midpoint connected to the radio frequency source and the distal outer ends of the solenoid coils, which correspond to the aforesaid aligned spaced ends of the quasi-closed solenoidal inductor, are connected to ground. A metallic housing having a discharge chamber therein is provided with two opposed walls having symmetrically opposed bone shaped ports. The ports are closed and vacuum sealed with insulating material and the ports each include two through side openings dimensionally respectively fitted to and engaging with the spaced ends of the quasi-closed solenoidal inductor. The bone shaped ports further include a through slot connecting the side openings along their center line for inductive excitation and maintenance of plasma in the operating gaps situated within the discharge chamber.

5 Claims, 6 Drawing Sheets

US 7,884,551 B2

RF PLASMA SOURCE WITH QUASI-CLOSED SOLENOIDAL INDUCTOR

CROSS REFERENCE

This application is a continuation-in-part of U.S. application Ser. No. 11/607,603, filed Dec. 1, 2006, now U.S. Pat. No. 7,514,875, for RF PLASMA SOURCE WITH QUASI-CLOSED FERRITE CORE.

FIELD OF INVENTION

The present invention relates to RF (radio frequency) plasma sources applicable to plasma processing technologies.

BACKGROUND OF THE INVENTION

RF inductively coupled plasma (ICP) sources are widely applied in plasma processing technologies for the manufacturing of semiconductor chips (etching, deposition, ion implantation, sputtering, pure silicon production) in the large panel display industry, micro-machine production, nanotechnology, and as the basis for ion sources [see Industrial Plasma Engineering", v. 1, by J. Reece Roth, ", pp. 391-413 (IOP Publishing Ltd, 1995)]. These types of sources are popular because of their ability to maintain high density plasmas at a relatively low operating gas pressure.

For a typical ICP source with a flat inductor coil wound on the surface of a vacuum-sealed port of an insulator and driven at 13.56 MHz, at an active RF power consumption in plasma of about 1 kW, the inner volume of the discharge chamber is a few liters, the operating gas pressure is in the range 1-100 mTorr, the resonant RF current of the coil is a few tens of amperes, and the RF voltage across the coil is a few kV [see for example FIG. 11.16 in a book "Industrial Plasma Engineering", v. 1, by J. Reece Roth, p. 413 (IOP Publishing Ltd. 1995)]. The RF power loss under these conditions in the matcher, connectors, and at the inductor coil is about the same as is consumed in plasma. Besides that, proximity of the coil and metallic walls of the discharge chamber leads to an additional power loss in these walls for inductive heating caused by eddy currents. The high value of the RF voltage (few kV) applied across the inductor coil causes a considerable capacitive current to pass through the coil, dielectric, and plasma to the chamber walls. This physical process builds a high negative dc potential on the surface of the insulator facing the plasma thereby accelerating the plasma ions toward this surface and causing surface erosion, plasma contamination, and an increase of plasma dc potential reference with respect to the chamber, all at the same time.

To overcome the considered problems, a quasi-closed ferrite core 2 with an actual primary winding 1 can be arranged with the discharge chamber 3 as it is shown in FIG. 1 [see E. Shun'ko, U.S. Patent Application Publication No. 2008/0088242, the entire contents of which are incorporated herein by reference], to induce in the discharge chamber an alternating vortex electrical field E capable of accelerating the electrons and exciting and maintaining plasma within the discharge chamber 3. However available ferrite core materials only allow development of a vortex potential in the operating gap of less than 80 V per one turn at the RF frequency of 500 kHz applied to the primary winding. A desirable increase of the operating frequency for thereby enabling one to obtain a vortex potential of above 110 V per one turn (which is necessary, for example, to maintain discharge in hydrogen, nitrogen, oxygen, etc.) is unachievable due to drastically increasing power loss in the core material with frequency increase.

The present invention enables one to overcome all the problems considered above.

SUMMARY OF THE INVENTION

The plasma source of the present invention is formed in a metallic discharge chamber equipped with symmetrically opposed bone-shaped vacuum-sealed ports sealed with an insulator and disposed between gaps of a quasi-closed solenoidal inductor coil. The O-type quasi-closed solenoid is in the form of two U-shaped displaced coil half sections to provide two operating gaps in the quasi-closed solenoidal inductor between disconnected ends. The gap ends of the solenoid coils are fitted externally to side openings of the bone-shaped ports, to let the alternating magnetic field of the solenoid, powered with RF, pass throughout the discharge chamber. The ends of the solenoid coils facing these insulated side openings of the bone-shaped ports are grounded.

As an alternative embodiment, only a single one of the U-shaped halves of the quasi-closed solenoidal inductor is provided and fitted to a corresponding single one of the bone-shaped port, the other bone-shaped port being omitted. A single wide operating gap formed between the ends of this single U-shaped half of the quasi-closed solenoidal inductor is provided for excitation and maintenance of plasma within the discharge chamber.

As yet another alternative embodiment, a plurality of the quasi-closed solenoidal inductors are assembled in parallel to one another in a column for providing a linear distribution of high uniformity plasma along the column.

In yet another arrangement, a plurality of the quasi-closed solenoidal inductors with wide single operating gaps are arranged to provide a two dimensional assembly for providing a uniform distribution of plasma about a required area.

As yet another embodiment, a plurality of the quasi-closed solenoidal inductors are assembled in parallel to one another in a column for thereby providing a linear distribution of highly uniform plasma along the column.

BRIEF DESCRIPTION OF THE DRAWINGS

Other objects and advantages appear hereinafter in the following description and claims. The accompanying drawings show, for the purpose of exemplification, without limiting the scope of the invention or the appended claims, certain practical embodiments of the present invention wherein:

DETAILED DESCRIPTION OF THE PREFERRED EMBODIMENTS

Figure 1:
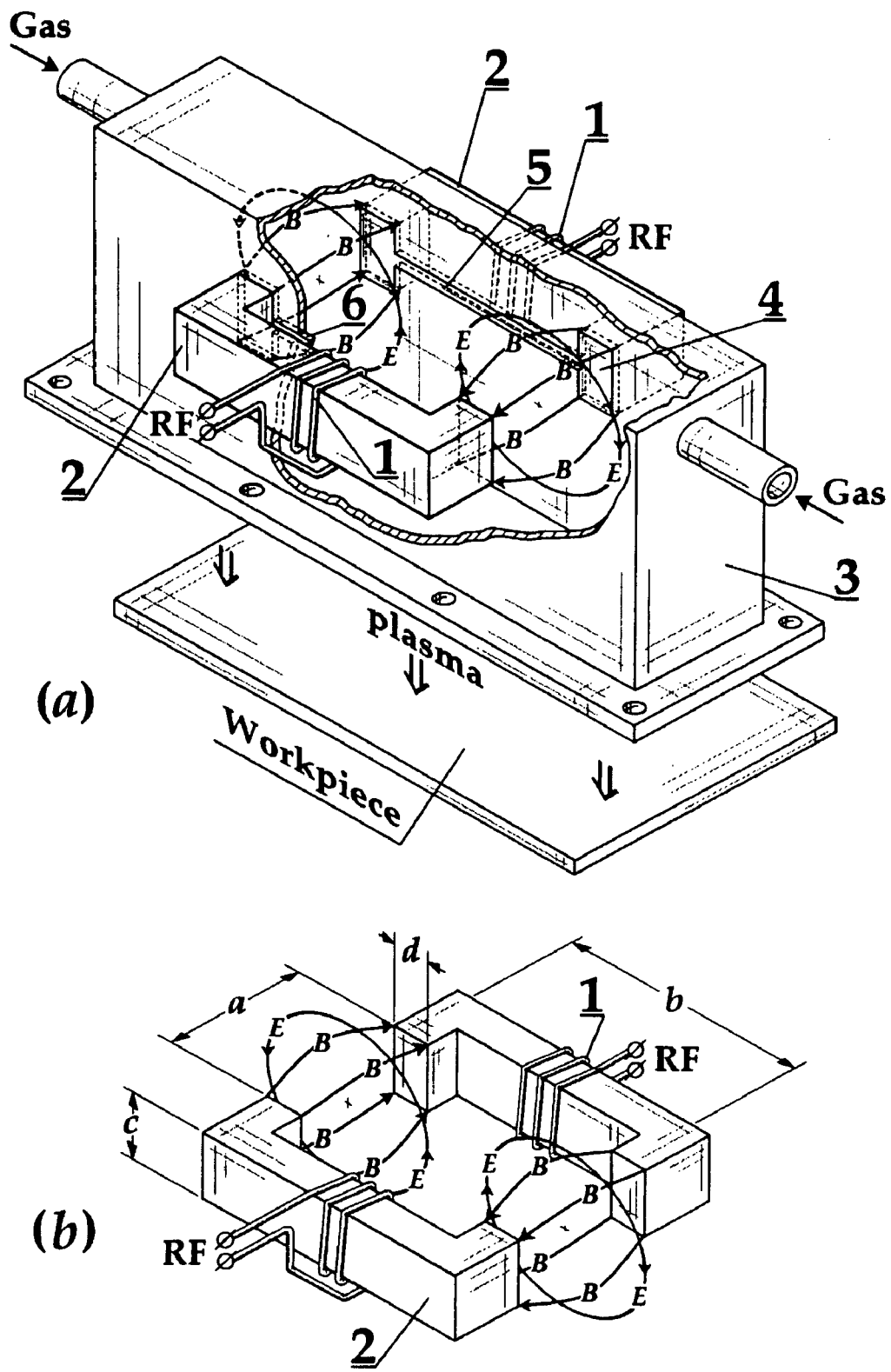
FIG. 1 is the schematic mid vertical sectional view of a known RF Plasma Inductor with a quasi-closed ferrite core (capable of generating an alternating vortex electric field E for accelerating the electrons for excitation and maintenance of plasma) with the quasi-closed ferrite core 2 disposed in the coil 1 of a primary winding and positioned relative to plasma charged discharge chamber 3 to provide a virtual closed secondary winding formed in the operating gaps of the ferrite core within the discharge chamber 3 [see U.S. Patent Application Publication No. 2008/0088242 by E. Shun'ko].
Figure 2:
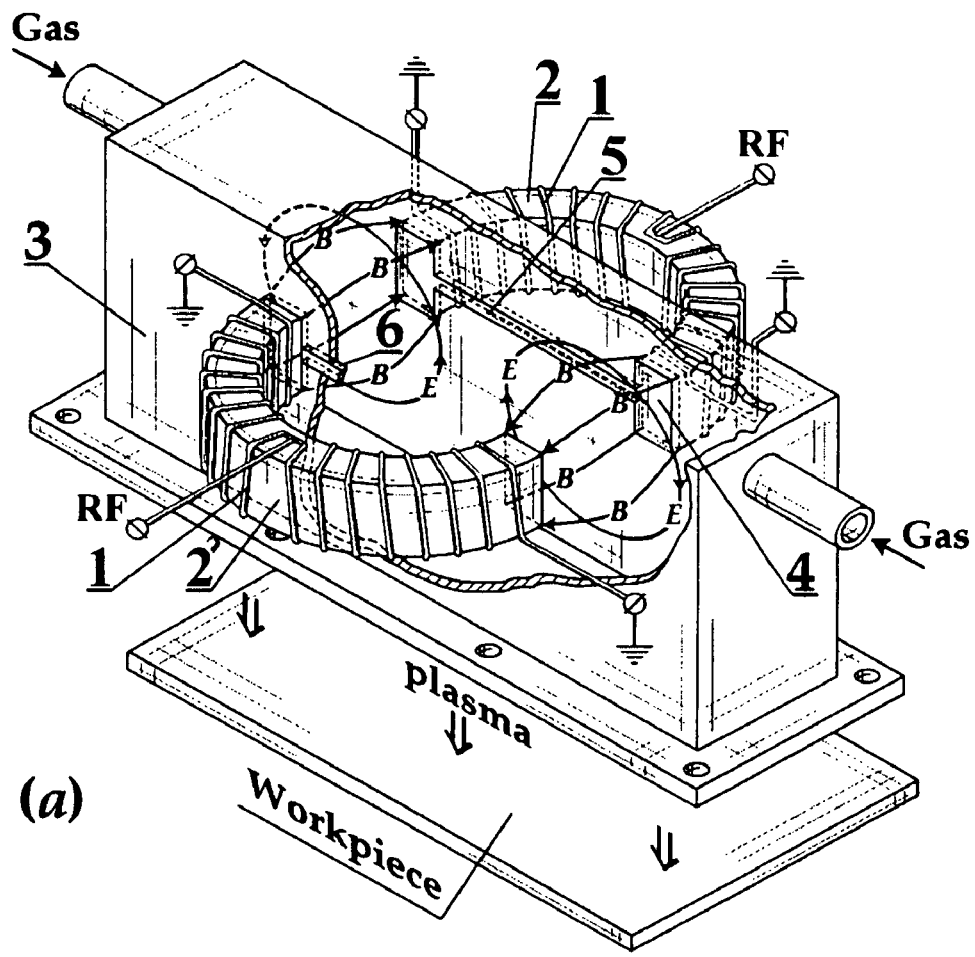
FIG. 2a is an isometric view in partial section to reveal internal portions of a plasma source with a quasi-closed solenoidal inductor of the present invention.
FIG. 2b is a schematic three dimensional view of the inductor presented in FIG. 2a formed of a single quasi-closed sectioned solenoid, showing character sizes of this solenoid and providing images of magnetic and electric field vectors mapped with assembly.
Figure 2:
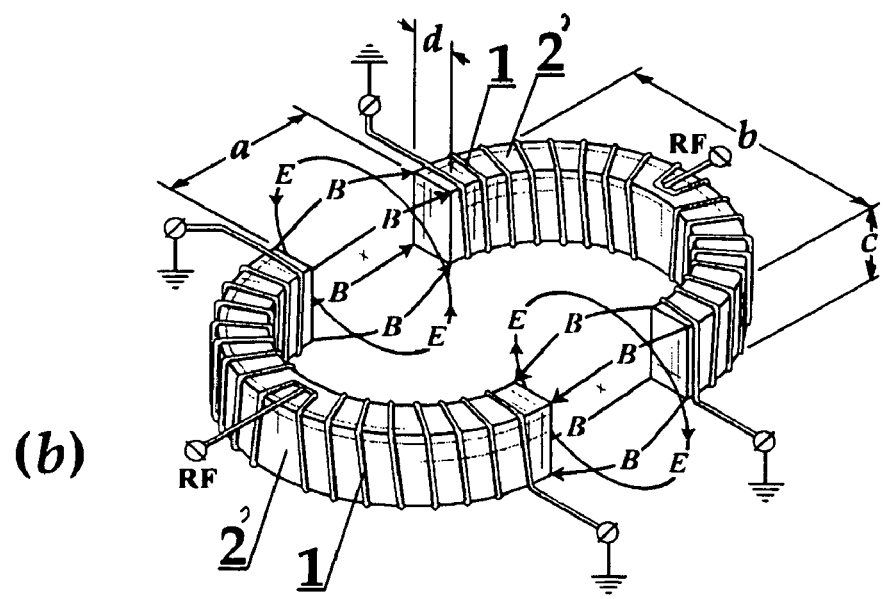

The plasma source with a quasi-closed solenoidal inductor made according to one embodiment of the present invention is shown in FIG. 2a by way of a three dimensional partial sectional view of the device. The device comprises a quasi-closed O-type solenoid 1 of two symmetrically placed and distanced U-shaped halves connected to RF power at their midpoints, and a metallic (aluminum, copper) open sided box-type housing 3 having a discharge chamber. Two opposite closest walls are equipped with opposed symmetrical bone-shaped ports comprised each of two trough side openings 4 corresponding in spacing to the distance between spaced ends of quasi-closed solenoidal inductor 1, and a through slot 5 connecting these openings. The bone shaped ports are closed and vacuum-sealed by a high-temperature insulator 6 (quartz, ceramic, sapphire). Two operating gaps are formed between the disconnected ends of the quasi-closed solenoidal inductor and provide an internal discharge chamber in the housing 3 to fit within the spaced ends of the solenoidal inductor between the side openings 4 of the bone-shaped ports. Cooling of the solenoid 1 can be provided by natural heat exchange with the surrounding air or by fabrication of the solenoid coils of metallic (copper) tube fed with flowing coolant (water). Cooling of the chamber walls is provided by a conventional water cooling system, if necessary (not shown in FIG. 2a). A gaseous working medium is supplied via two pipes connected symmetrically on the opposite end walls of the housing 3, see FIG. 2a. Yield of operating plasma and gas evacuation are provided throughout the open side of the housing 3 equipped with a securing flange for this purpose, as is shown in FIG. 2a. The device shown in FIG. 2a can be powered with a standard power supply of 300-500 W, at 10-50 MHz.

FIG. 2b is a three dimensional schematic view of the solenoidal inductor of the present invention for an embodiment shown in FIG. 2a. It is presented as a unit formed of an O-type quasi-closed solenoidal inductor 1 connected to an RF power supply, to generate the alternating magnetic field B with vectors crossing the operating gaps of width a formed between the disconnected ends of the quasi-closed solenoidal inductor 1. The flux of the alternating magnetic field B induces the alternating vortex electric field E in the operating gaps, accelerating plasma electrons forming further loops of actual electron currents (virtual secondary winding) along the direction vectors E, and exciting and maintaining plasma leaving the operating gaps in directions lying in the plane of the device symmetry which is parallel to the operating gaps. The general physical sizes of the quasi-closed solenoidal inductor are presented in FIG. 2b for reference purposes. The discharge chamber housing 3 with bone-shaped ports admitting the alternating magnetic flux is not shown in this figure for clarity purposes.

Figure 3:
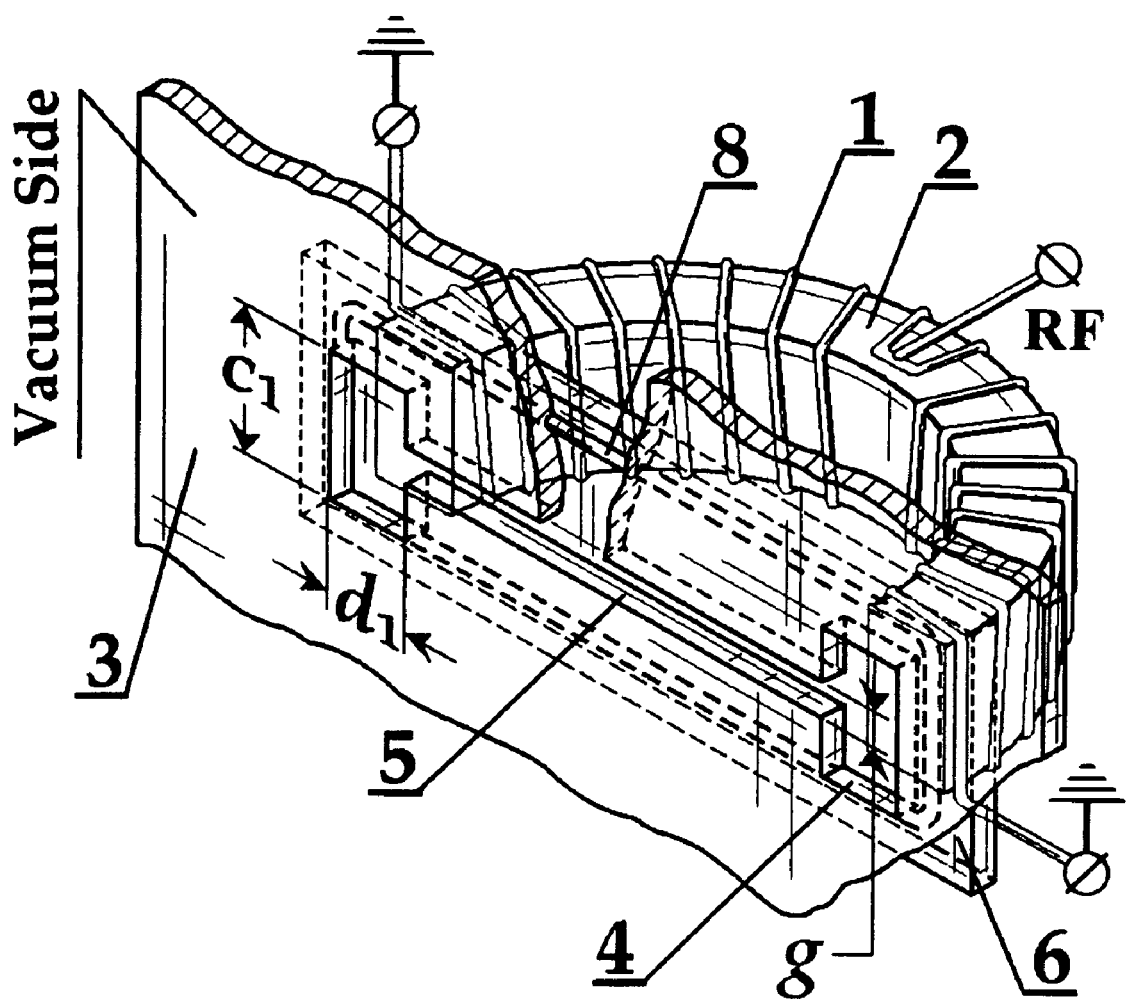
FIG. 3 is an enlarged isometric partial sectional view of a fragment of a discharge chamber wall of the structure of FIG. 2a equipped with a bone-shaped port closed and sealed with insulator material and assembled with a single U-shaped part of the quasi-closed solenoidal inductor.

FIG. 3 is a three dimensional enlarged partial sectional detail view of a fragment of the discharge chamber housing wall equipped with the bone shaped port comprising two through side openings 4 and a through slot 5 connecting these openings. This port is closed by the dielectric plate 6 and vacuum sealed by the O-ring 8 from the atmosphere side of the wall. The U-shaped half of the quasi-closed solenoidal inductor 1 wound on the bobbin 2' of an insulator is mounted to this dielectric plate 6 from its exterior or atmosphere side to fit the solenoid ends with side-openings 4 of the bone-shaped port. The sizes $c_1$ and $d_1$ of the side openings 4 should slightly exceed the corresponding sizes c and d (see FIG. 2a) of the aperture for the ends of the quasi-closed solenoidal inductor coil to admit the bulk part of the magnetic flux expanding spatially within the discharge chamber. The width g of the through slot 5 is about 1.5-2 mm, and a preferable slot cross section is a chevron shape (not shown in FIG. 4) to protect the insulator plate 6 from direct interaction with plasma components.

Figure 4:
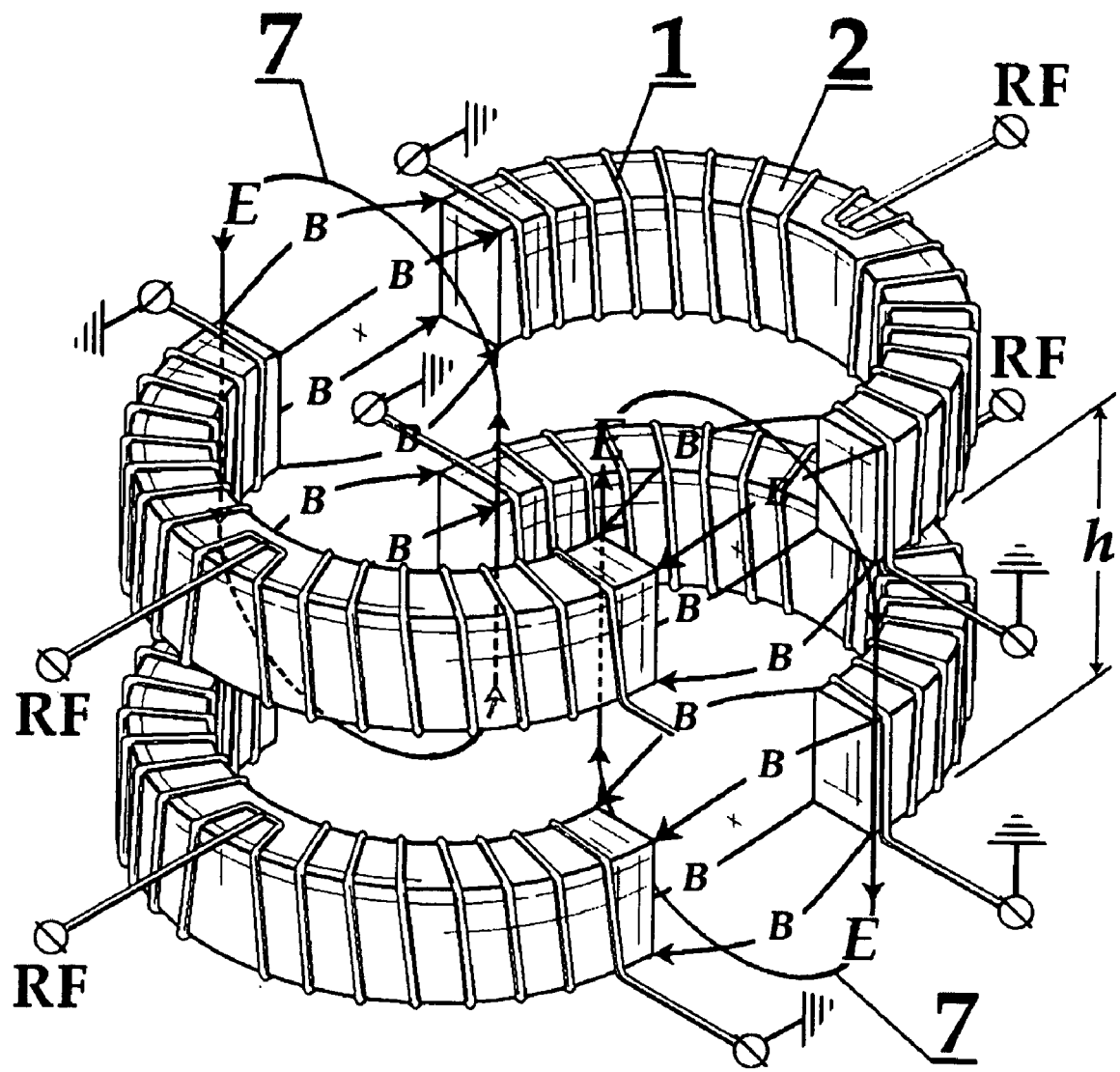
FIG. 4 is a schematic three dimensional isometric view of a column of two quasi-closed solenoids of the present invention inducing combined loops of an alternating vortex electrical field in the operating gaps.

FIG. 4 is a three dimensional view of a main portion of one of the present invention embodiments developed from the embodiment shown in FIG. 2a, by arrangement of two operating units of quasi-closed solenoidal inductors placed in parallel to one another in a column. In this configuration, the vector E components parallel to the main solenoid plane of the nearest units are subtracted, being oppositely directed, and two neighboring electric field vortexes form one common vortex 7 in place of two, as is shown in FIG. 4, or more units, providing in this way formation of closed loops of an electron current of corresponding length. These closed electron current loops maintain in their turn formation of uniform linear plasma along the column of a required length expanding in the direction of any open space.

Figure 5:
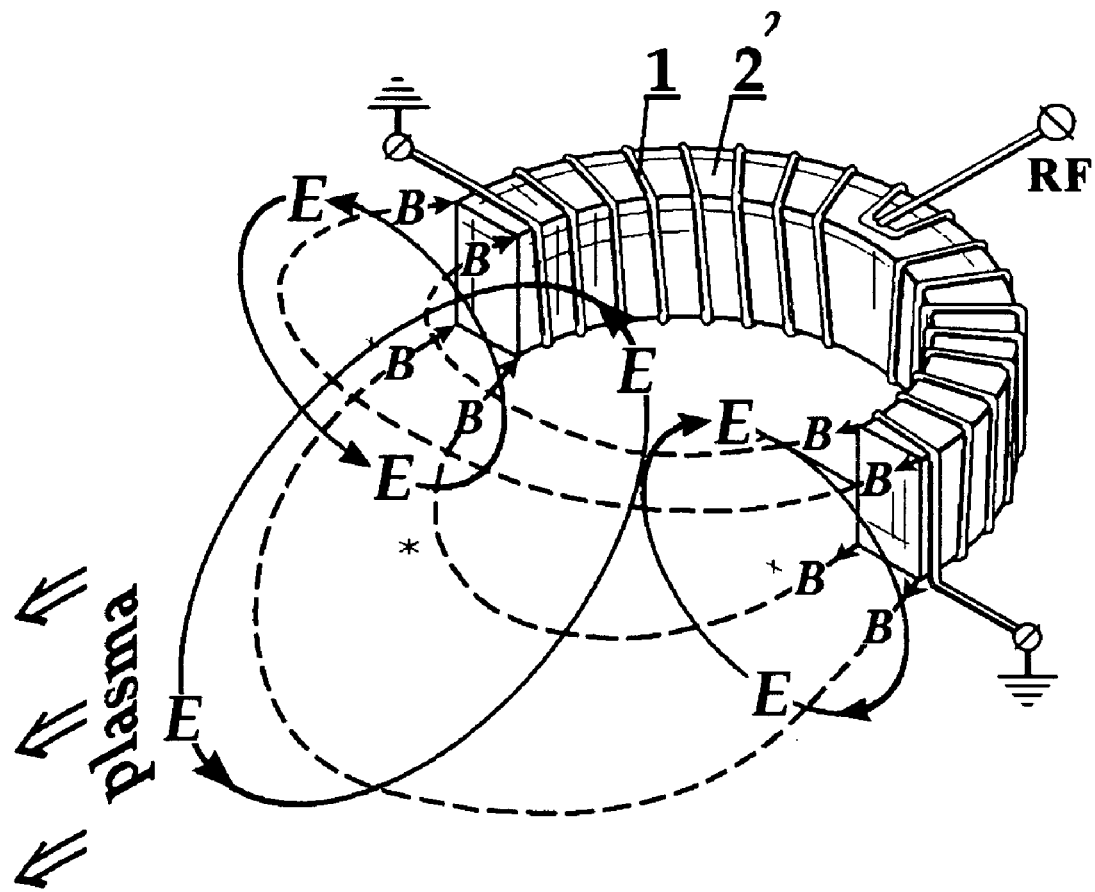
FIG. 5 is a schematic three dimensional isometric view of a quasi-closed solenoidal inductor of the present invention having a wide operating gap generating magnetic and vortex electric alternating fields developed in the operating gap and forming the corresponding vectors mapped in this figure.

FIG. 5 is a three dimensional view of a main portion of one of the present invention embodiments developed from the embodiment shown in FIGS. 2a, and 2b by cutting the O-type quasi-closed solenoidal inductor in half along its main plane. Only one of the U-shaped halves of the quasi-closed solenoidal inductor 1, wound on a bobbin 2' and forming the primary winding connected to RF power, is shown in this figure with alternating magnetic field vectors B originating from one open end of the U-shaped solenoidal inductor and ending on another one. The vectors of the alternating vortex electric field E induced by the alternating magnetic flux are mapped in this figure as well. Plasma electrons accelerated in this electric field E excite and maintain discharge plasma acquiring a preferable direction of propagation outward from the U-shape inductor. The operating unit shown in FIG. 5 should be mounted on a metallic wall or flange equipped with the bone shaped port closed and vacuum sealed with an insulator as is shown for example in FIG. 3. It is understood that a maximum density of magnetic flux and consequently the value of the electrical field induced by the U-shaped quasi-closed solenoidal inductor with a wide operating gap shown in FIG. 5 is less than ones developed by the conventional quasi-closed solenoidal inductor with two narrower operating gaps shown in FIGS. 2a, b. Consequently the density of plasma generated by the unit of this embodiment is expected to be less as well.

Figure 6:
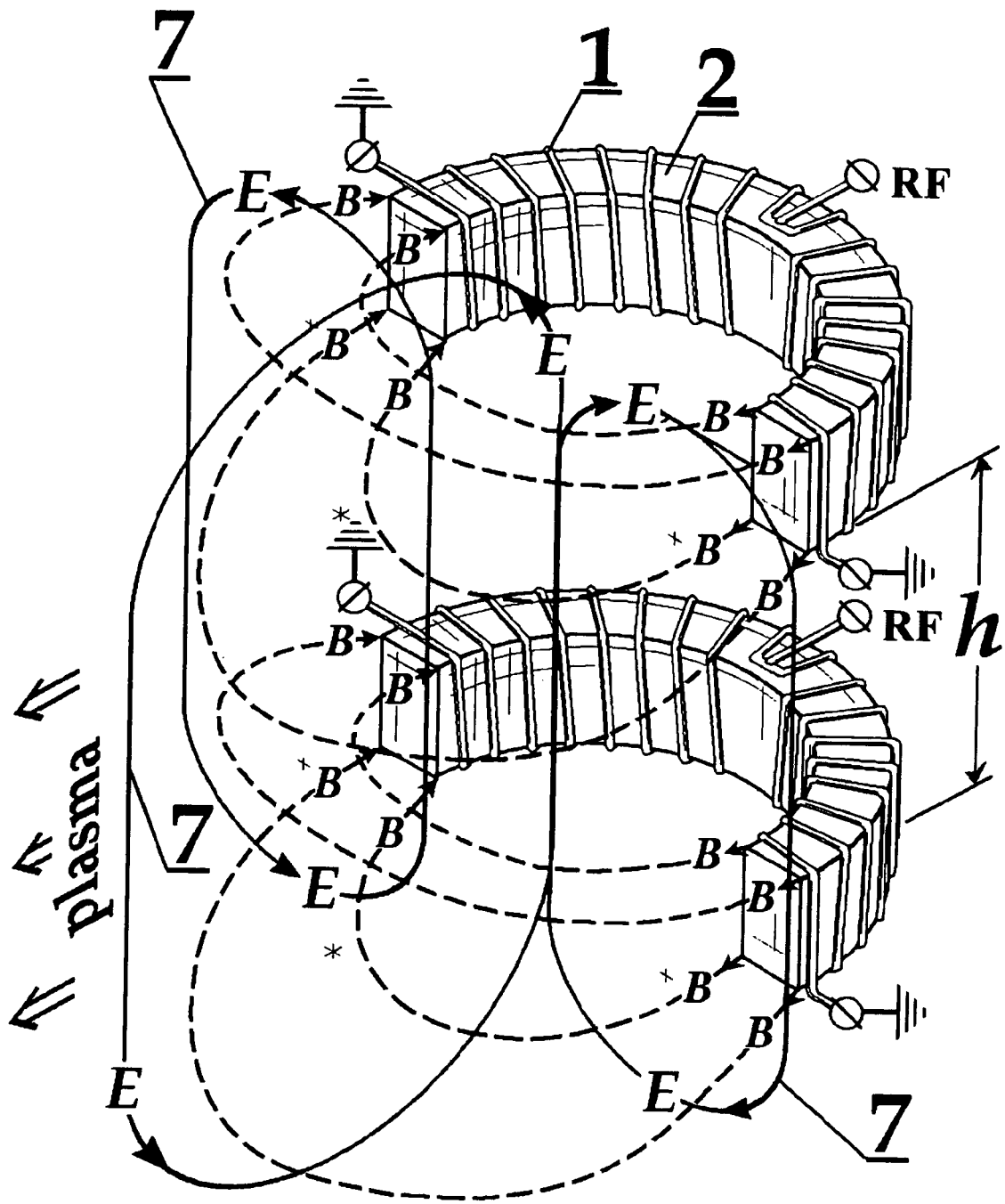
FIG. 6 is a schematic three dimensional isometric view of a column assembled of two quasi-closed solenoidal inductor halves having wide operating gaps and inducing combined loops of an alternating vortex electrical field exciting and maintaining a single linear plasma beam in accordance with the teachings of the present invention.

FIG. 6 is a three dimensional view of a main portion of one of the present invention embodiments developed from the embodiment shown in FIG. 5 by arrangement of two operating units of U-shaped quasi-closed solenoidal inductors positioned in parallel to one another in a column. In this configuration, the vector E components parallel to the main planes of the nearest units are subtracted, being oppositely directed, and two neighboring electric field vortexes are induced by neighboring units form one common vortex 7 in place of two, as it is shown in FIG. 6, or more units arranged in a single column providing in this manner formation of closed loops of electron current of corresponding length. This closed electron current loop maintains in its turn formation of extremely uniform linear plasma along the column of a required length (defined by the quantity of the plasma inductor units arranged in the column) to perform industrial conveyor type treatment of large surface areas, and to provide a gas medium excitation for gas lasers. Preferable direction of plasma propagation for this column type source is shown in FIG. 6 by fashioned arrows.

Each bone-shaped port provided in the discharge chamber walls (3 in FIGS. 2a and 3) is shaped of two through side openings (4 in FIGS. 2a and 3), corresponding to the displaced ends of the quasi-closed solenoid, and a through slot (5 in FIGS. 2a and 3) connecting these openings. The alternating magnetic field B passing throughout gaps between spaced halves of the solenoid (operating gaps) within the discharge chamber induces in the operating gaps a vortex electric field E capable of accelerating the electrons, and consequently to excite and to maintain discharge plasma in an operating gas filling this chamber (see FIGS. 2a, 2b, 3, 4, 5, 6). The actual electron current induced in plasma by the vortex electrical field E forms closed loops of alternating current (virtual secondary winding) decreasing the value of the magnetic field B (having a minimum at a gap center plane in any regard) within gaps that improves the decompression of plasma electrons from the walls and provides in this way a sufficient plasma wall insulation.

The present invention provides a well localized source of high purity plasma comprising a quasi-closed sectioned solenoidal inductor (1 in FIGS. 2a, b), a discharge chamber (3 in FIG. 2a) equipped with bone-shaped ports of vacuum-sealed high-temperature insulator (quartz, silica, ceramic), and inserted in operating gaps of the quasi-closed solenoidal inductor to fit side openings (4 in FIG. 2a) of the bone-shaped ports with separated ends of the quasi-closed solenoidal inductor. A vacuum-sealed through slot (5 in FIGS. 2a and 3) connecting the side openings (4 in FIGS. 2a and 3) serves to prevent formation of short-circuits around the side openings (4 in FIGS. 2a and 3) admitting the alternating magnetic field B of the quasi-closed solenoidal inductor into the discharge chamber. A flux of the alternating magnetic field B passing throughout the discharge chamber induces the alternating vortex electrical field E acting along loops enveloping the alternating magnetic flux as it is shown in FIGS. 2b, 4, 5, 6, wherein the discharge chamber with its bone-shaped ports is not shown for clarity. The electrons accelerated in the electrical field E, igniting and maintaining discharge plasma in the operating gaps of the quasi-closed solenoidal inductor, develop the actual alternating vortex electron currents forming a virtual secondary winding in the plasma. These alternating vortex currents decrease the value of the magnetic field B in the operating gaps and improve in this manner insured plasma wall thermoinsulation. The effect of the thermoinsulation is emphasized by a natural decrease of the electromagnetic energy density, and consequently electromagnetic field pressure, toward the central plane of the gaps. Relatively high electron energy (100-150 eV) developed in the vortex electrical fields promotes plasma expansion by ambipolar diffusion in the preferred directions defined by any open space of the vacuum chamber.

The small side-openings of the bone-shaped ports do not face intense plasma because of there is a positive gradient of the magnetic field toward the openings and conservation of a total angular momentum for electrons in the magnetic field (magnetic trap effect) in this area. The through slot (5 in FIGS. 2a and 3) connecting the side openings of the bone-shaped port is cut to prevent formation of a short circuit around the openings admitting the alterating magnetic field B into the chamber. To protect the insulator closing this slot from a direct interaction with dense plasma, this slot cross-section can be provided with a chevron or V shape. The insulator closing and vacuum-sealing the side openings and engaged with the slot of the bone-shaped port can be, for example, designed as the single rectangular solid plate (6 in FIG. 3) sealed by an O-ring (8 in FIG. 3) from the atmosphere side of the discharge chamber as is shown in FIG. 3. The sizes of the side openings $c_1$ and $d_1$ (see FIG. 3) of the bone-shaped port should be insignificantly more that the corresponding sizes c and d (see FIG. 2b) of the quasi-closed solenoid coil aperture to permit a bulk part of the alternating magnetic flux provided at this location to pass. The preferred width g of the slot 5 (see FIG. 3) should not be decreased to a value less than 1-2 mm due to the fact that a further decrease can create a significant electric capacity between the closest opposite sides of the slot. This forms in this manner a capacitively shorted circuit for induced virtual alternating vortex currents, hampering in this case a penetration of the alternating magnetic flux into the chamber. The preferred cross section of the slot is chevron shaped to prevent a direct plasma interaction with the portion of the insulator 6 (in FIG. 3) facing plasma.

The source of plasma shown schematically in FIGS. 2a, b can be developed to a linear plasma source of any required length. For this purpose the quasi-closed solenoidal inductors should be mounted in parallel to one another in a column, as is shown in FIG. 4. Indeed in this column, components of the E vectors induced by the nearest units which are parallel to the main plane of quasi-closed solenoids are subtracted being of opposite directions, and two neighboring electric field vortexes induced by the neighboring solenoids form one common vortex 7 for two (see FIG. 4) or more units, providing in this way formation of closed loops of electron current of corresponding length. These closed loops of electron current form and maintain, in their turn along the column, uniform linear plasma expanding in the direction of any open space. The uniformity of this linear plasma beam is defined by the distance h between units (see FIG. 4), and deviation of plasma density from its average value along the linear plasma beam produced by the same column can be easily made less than 1%.

The value of the operating gap a (see FIG. 2a) formed between the ends of the separated parts of the quasi-closed solenoidal inductor defines a value of the density of plasma induced in the gap: the more the distance a is, the less is the density. Therefore the value a should be chosen from the requirements of the technology for which the plasma source is developed. However in cases where the distance a becomes more than the average distance b (see FIG. 2a) between ends of the separated or spaced U-shape parts of the quasi-closed solenoid, a>b, the magnetic flux generated by the single U-shaped part of the solenoidal inductor is closed from one of its cut ends to another one of the same part as is shown in FIG. 5. The single U-shaped part of the quasi-closed solenoidal inductor (powered with RF) being assembled with the discharge chamber by the bone shaped port shown in FIG. 3, induces in the chamber the vortex electric field E with the profile shown schematically in FIG. 5 by closed loops. The electric field E accelerates plasma electrons forming further closed loops of the actual alternating electron currents generating and maintaining plasma. The preferred direction of plasma propagation from this type of plasma source is shown in FIG. 5 by the fashioned arrows. Thus the properties of the single U-shaped part of the quasi-closed solenoidal inductor are similar to the ones described for the conventional quasi-closed solenoidal inductor with two actual flat operating gaps described above. In view of this fact, it is natural to consider the separated U-shaped part of the quasi-closed solenoidal inductor as a single quasi-closed solenoidal inductor with a wide operating gap. The character feature of the quasi-closed solenoidal inductor with a wide operating gap is the formation of the single loop of alternating electron current in the plasma with relatively lower (3-5 folds) density than the one generated by a conventional quasi-closed solenoidal inductor shown in FIGS. 2*a, b*. The quasi-closed solenoidal inductors with the wide operating gaps can be also assembled in a column to obtain uniform closed electron loop 7 (see FIG. 6) of necessary length for generation and maintenance of a uniform linear plasma beam applicable for conveyor type technologies and for excitation of high power gas lasers (CO, $CO_2$, Ar, Kr, etc.).

I claim:

1. An inductively coupling plasma source comprising:
a radio frequency source;
including a quasi-closed O-type solenoidal inductor comprised of two equal sectioned U-shaped solenoid coil halves separated from one another to form two operating gaps between aligned spaced ends of said solenoid coil halves, each said U-shaped half of said solenoid coil being sectioned to have an electrical midpoint connected to said radio frequency source and distal outer ends of said solenoid coil halves corresponding to said spaced ends of said quasi-closed solenoidal inductor connected to ground;

a metallic housing having a discharge chamber therein and two opposed walls having symmetrically opposed bone shaped ports, said ports closed and vacuum sealed with insulating material and each comprising two through side openings dimensionally respectively fitted to and engaged with said spaced ends of said quasi-closed solenoidal inductor and a through slot connecting said side openings along their centerline for inductive excitation and maintenance of plasma in said operating gaps situated within said discharge chamber.

2. An inductively coupling plasma source as recited in claim 1 wherein only a single one of said U-shaped halves of said quasi-closed solenoidal inductor is provided and fitted to a corresponding single one of said bone shaped ports, the other said bone shaped port being omitted;

a single wide operating gap formed between said ends of said single U-shaped half of said quasi-closed solenoidal inductor for excitation and maintenance of plasma in said single wide operating gap positioned in this manner within said discharge chamber.

3. An inductively coupling plasma source as recited in claims 2, including a plurality of said quasi-closed solenoidal inductors assembled in parallel to one another in a column for providing a linear distribution of high uniformity plasma along said column.

4. An inductively coupling plasma source as recited in claim 2, including a plurality of said quasi-closed solenoidal inductors with said wide single operating gaps arranged to provide a two dimensional assembly for providing a uniform distribution of plasma about a required area.

5. An inductively coupled plasma source as recited in claim 1, including a plurality of said quasi-closed solenoidal inductors assembled in parallel to one another in a column for providing a linear distribution of high uniformity plasma along said column.

* * * * *